United States Patent [19]
Lee

[11] Patent Number: 6,110,776
[45] Date of Patent: Aug. 29, 2000

[54] METHOD FOR FORMING BOTTOM ELECTRODE OF CAPACITOR

[75] Inventor: Michael Lee, Ta-Li, Taiwan

[73] Assignee: United Integrated Circuits Corp., Hsinchu, Taiwan

[21] Appl. No.: 09/299,721

[22] Filed: Apr. 26, 1999

[30] Foreign Application Priority Data

Feb. 4, 1999 [TW] Taiwan ................................. 88101685

[51] Int. Cl.⁷ ............................................. H01L 21/8242
[52] U.S. Cl. ............................................ 438/254; 438/397
[58] Field of Search ........................... 438/238, 253–256, 438/393–399, 381

[56] References Cited

U.S. PATENT DOCUMENTS

| | | | |
|---|---|---|---|
| 6,033,951 | 3/2000 | Chao | 438/253 |
| 6,037,212 | 3/2000 | Chao | 438/253 |

*Primary Examiner*—Jey Tsai
*Attorney, Agent, or Firm*—Jiawei Huang; J.C.Patents

[57] ABSTRACT

A method for forming a bottom electrode of a capacitor is provided. A substrate having a conductive region is provided. A first insulation layer, a stop layer and a second insulation layer are formed on the substrate in order. The first insulation layer, the stop layer and the second insulation layer are patterned to form an opening. The opening exposes the conductive region in the substrate. A first conductive layer is formed on the second insulation layer and fills the opening, and then the first conductive layer is defined to form a plug and a metal plate. The plug can be electrically connected with the conductive region. The metal plate is used as a mask, and the second insulation layer is removed by anisotropic etching to form a third insulation layer having a first distance from the third insulation layer surface to the stop layer surface. Then, the third insulation layer is removed by isotropic etching to form a fourth insulation layer having a second distance from the fourth insulation layer surface to the stop layer surface. A second conductive layer is formed on the fourth insulation layer and the metal plate. Finally, the second conductive layer is removed by anisotropic etching to expose the metal plate and a portion of the fourth insulation layer. Then, the fourth insulation layer is removed by isotropic etching to expose the stop layer and the plug.

16 Claims, 3 Drawing Sheets

METHOD FOR FORMING BOTTOM ELECTRODE OF CAPACITOR

CROSS-REFERENCE TO RELATED APPLICATION

This application claims the priority benefit of Taiwan application Ser. No. 88101685, filed Feb. 4, 1999, the full disclosure of which is incorporated herein by reference.

BACKGROUND OF THE INVENTION

1. Field of the Invention

The present invention relates to a method for forming a semiconductor device. More particularly, the present invention relates to a method for forming a bottom to electrode of a capacitor in dynamic random access memory (DRAM).

2. Description of the Related Art

As the function of a microprocessor becomes more powerful, the program and calculation of software becomes more complicated, and thus the need for Dynamic Random Access Memory (DRAM) storage memory is increased. As the number of semiconductor devices incorporated in an integrated circuit increases, a memory cell, which comprises a transfer field effect transistor (TFET) and a storage capacitor, is widely used. FIG. 1 is a circuit diagram of a DRAM memory cell. A capacitor C selected from an array of capacitors is used to store information as binary data by charging/discharging the capacitor C. Normally, a binary bit is stored in each capacitor, and when the capacitor C is free of charge, logic "0" is represented, whereas when the capacitor is fully charged, logic "1" is represented. In general, a dielectric film 101 is deposited between a top electrode (cell electrode) 102 and a bottom electrode (storage electrode) 100. The capacitor C is electrically coupled with a bit line BL. The read/write operation of the DRAM memory cell is performed by charging/discharging the capacitor C. The bit line BL is connected to the drain of a transfer field effect transistor T. The capacitor C is connected to the source of the transfer field effect transistor T. A signal is transmitted through a gate of the transfer field effect transistor T, which is used to control the capacitor C by turning on or off the connection with the bit line BL. In other words, the transfer field effect transistor T acts as a switch to control the charging and discharging of the capacitor C.

In a traditional DRAM, 2-dimensional capacitors called planar type capacitors are mainly used to store data. However, the planar type capacitors are not suitable for Therefore, a highly integrated DRAM needs 3-dimensional capacitors, such as stacked-type capacitors or trench type capacitors, to achieve the required performance level.

Compared to the planar type capacitors, the stacked-type capacitors or the trench-type capacitors can obtain a great amount of capacitance. However, the simple 3-dimensional capacitor is no longer adapted when a much more highly integrated DRAM is introduced.

Due to the requirement of continuously increasing integration, the memory cells of DRAM need to be further shrunk. It is well known by those skilled in the art that the more the memory cells shrink, the less the capacitance thereof will be. This causes the probability of a soft error created by the incidence of a α ray to increase. Therefore, a structure and a method of forming a capacitor having a desired capacitance even though the capacitor is further reduced in size, is urgently required.

SUMMARY OF THE INVENTION

Accordingly, the purpose of the present invention is to provide an improved method for forming a capacitor. The capacitor increases the surface area to enhance the amount of charge (capacitance) that can be stored on the capacitor. In addition, the invention increases process tolerance to enhance device yield and also lowers the cost of manufacturing devices.

To achieve these and other advantages and in accordance with the purpose of the invention, as embodied and broadly described herein, the invention provides a method for forming a bottom electrode of capacitor. A substrate having a conductive region is provided. A first insulation layer, a stop layer and a second insulation layer are formed in order on the substrate. The first insulation layer, the stop layer and the second insulation layer are patterned to form an opening. The opening exposes the conductive region in the substrate. A first conductive layer is formed on the second insulation layer and fills the openings and then the first conductive layer is defined to form a plug and a metal plate. The plug can be electrically connected with the conductive region. The metal plate is used as a mask, and the second insulation layer is removed by anisotropic etching to form a third insulation layer having a first distance from the third insulation layer surface to the stop layer surface. Then, the third insulation layer is removed by isotropic etching to form a fourth insulation layer having a second distance from the fourth insulation layer surface to the stop layer surface. A second conductive layer is formed on the fourth insulation layer and the metal plate. Finally, the second conductive layer is removed by anisotropic etching to expose the metal plate and a portion of the fourth insulation layer. Then, the fourth insulation layer is removed by isotropic etching to expose the stop layer and the plug.

It is to be understood that both the foregoing general description and the following, detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description serve to explain the principles of the invention. In the drawings.

DESCRIPTION OF THE PREFERRED EMBODIMENTS

Figure 1:
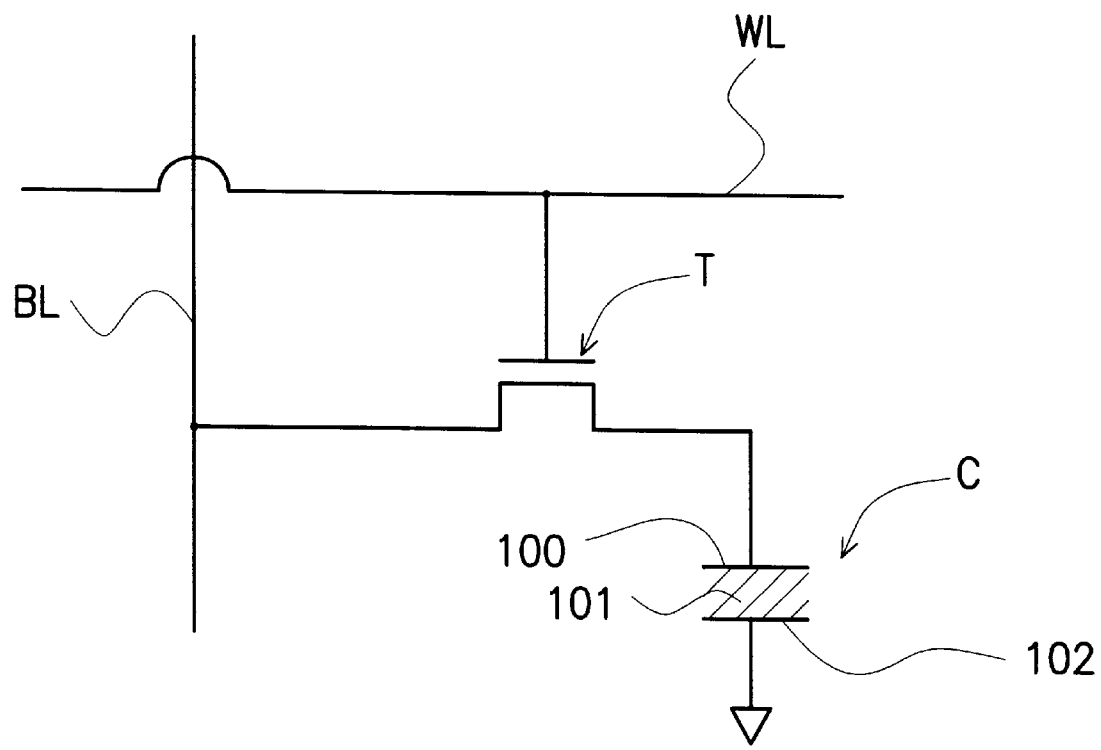
FIG. 1 is a circuit diagram of a DRAM memory cell.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic, cross-sectional views showing the progression of manufacturing steps for a bottom electrode of a capacitor in accordance with the preferred embodiment of the present invention.

Figure 2A:
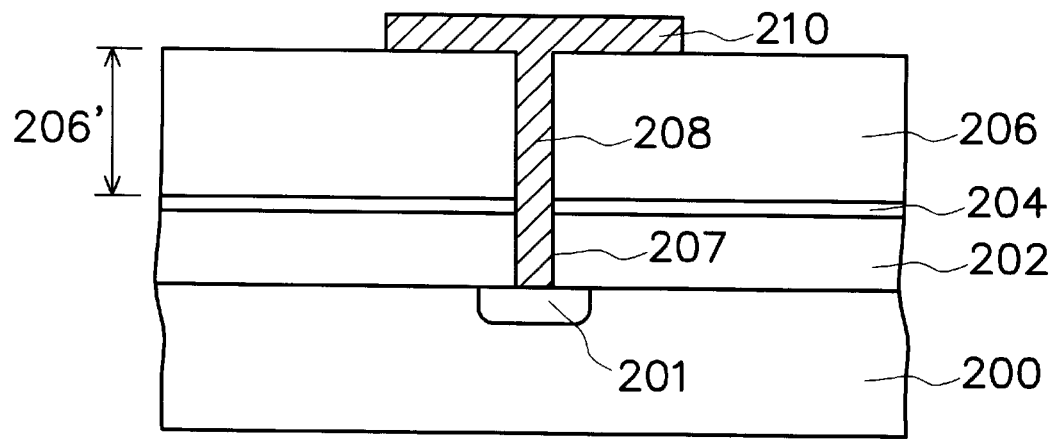
FIGS. 2A through 2F are schematic, cross-sectional views showing the progression of manufacturing steps for a bottom electrode of a capacitor in accordance with the preferred embodiment of the present invention.

Referring, to FIG. 2A, a substrate 200 having at least a conductive region 201 is provided; the conductive region 201 is a source/drain region of transistor for example. An insulation layer 202, a stop layer 204 and an insulation layer 206 are formed on the substrate 200 in order. The insulation layer 202 made of a material such as silicon oxide is formed, for example, by low pressure chemical vapor deposition (LPCVD). The stop layer 204 made of a material such as silicon nitride is formed, for example, by low pressure chemical vapor deposition (LPCVD). The insulation layer 206 made of a material such as silicon oxide is formed, for example, by low pressure chemical vapor deposition (LPCVD). The insulation layer 202, the stop layer 204 and the insulation layer 206 are defined, for example, by photolithography and etching to form an opening 207, which can serve as a contact window. The opening 207 exposes the conductive region 201 in the substrate 200. A conductive layer (not shown) is formed on the insulation layer 206 and fills the opening 207, and then the conductive layer is defined to form a plug 208 and a horizontal conductive layer as a metal plate 210. The plug 208 and the metal plate 210 form a T-shaped conductive layer (from the cross-sectional view). The metal plate 210 and the plug 208 can be made of a material such as polysilicon. The plug 208 can be electrically connected with the conductive region 201, and the metal plate 210 can be electrically connected with the conductive region 201 through the plug 208 because the metal plate 210 contacts with the plug 208. The insulation layer 206 is at least twice as thick as the metal plate 210.

Figure 2B:
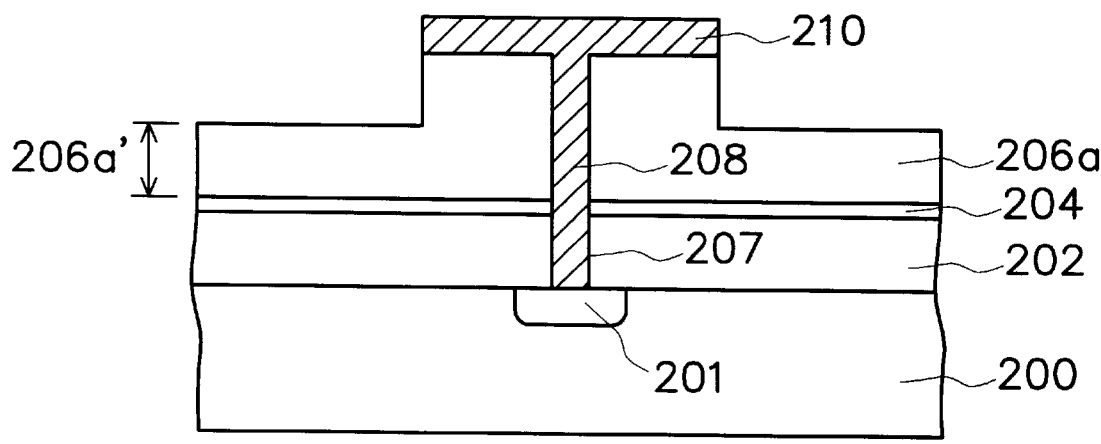

Referring to FIG. 2B the metal plate 210 is used as a mask, and a top portion of the insulation layer 206 exposed by the metal plate 210 is removed, for example, by anisotropic etching to form an insulation layer 206a. A distance 206a' measured from the top surface of the insulation layer 206a to the top surface of the stop layer 204 is about three fourths of a distance 206' (shown in FIG. 2A) measured from the top surface of the insulation layer 206 to the top surface of the stop layer 204.

Figure 2C:
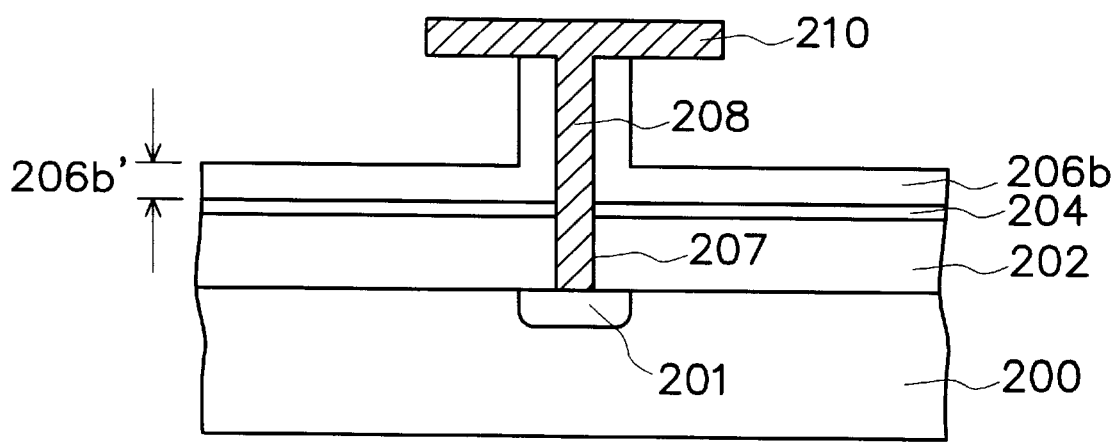

Referring to FIG. 2C, a portion of the insulation layer 206a is removed, for example, by isotropic etching to form an insulation layer 206b. The plug 208 is preferably covered by the insulation layer 206b. A distance 206b' measured from the top surface of the insulation layer 206b to the top surface of the stop layer 204 is about one fourth of the distance 206' (shown as FIG. 2A) from the insulation layer 206 surface to the stop layer 204 surface. The isotropic etching such as wet etching is performed, for example, using a hydrogen fluoride (HF) solution as an etchant. For example, the thickness of the insulation layer 206 and the subsequently formed bottom electrode determine the thicknesses of the insulation layer 206a and the insulation layer 206b. These are designed to meet product specifications.

Figure 2D:
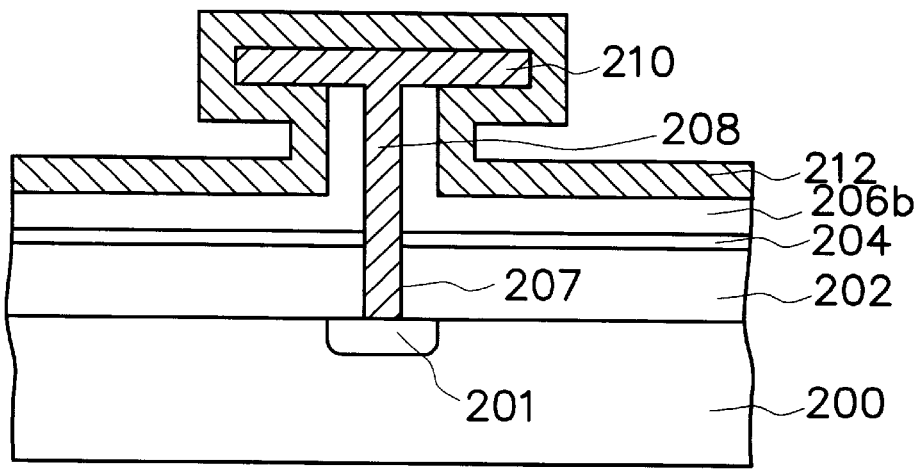

Referring to FIG. 2D, a conductive layer 212 is formed on the insulation layer 206b and the metal plate 210. The conductive layer 212 is made of a material such as polysilicon.

Figure 2E:
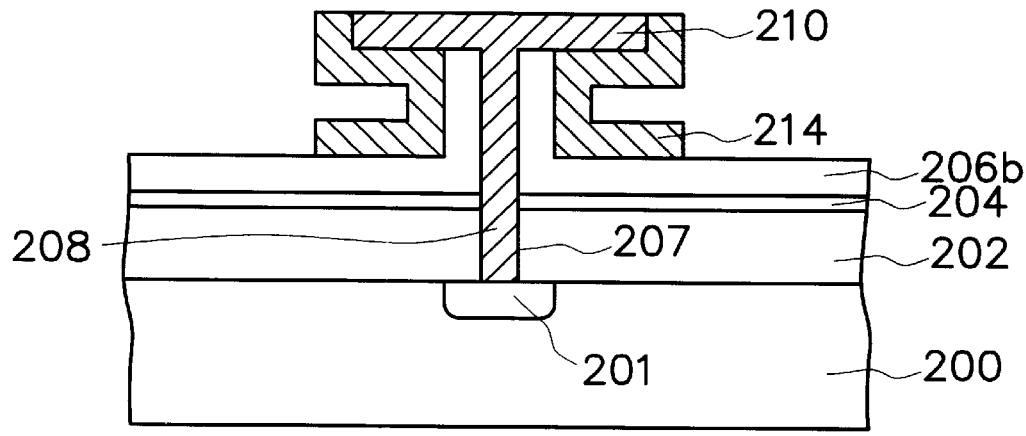

Referring to FIG. 2E, a portion of the conductive layer 212 is removed for example, by anisotropic etching to expose the top surface of the metal plate 210 and a portion of the insulation layer 206b. Then, a conductive layer 214 is formed.

Figure 2F:
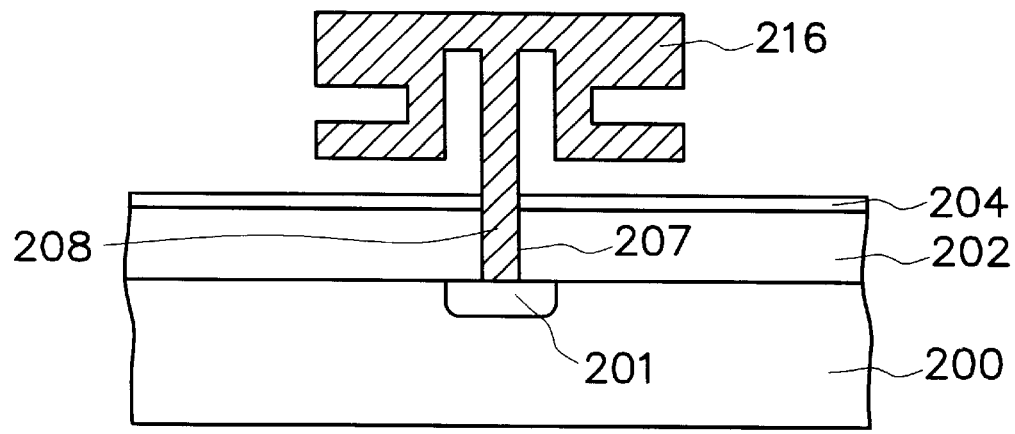

Referring to FIG. 2F, the insulation layer 206b is removed for example, by isotropic etching to expose the plug 208 and the stop layer 204. A bottom electrode 216 of a capacitor comprising the plug 208, the metal plate 210 and the conductive layer 214 is complete.

The invention provides a method for forming a bottom electrode of a capacitor. The method increases a surface area of the bottom electrode to enhance the amount of charge (capacitance) that can be stored on the capacitor. In addition, the invention also increases yield and lowers the cost of manufacturing devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method for forming a bottom electrode of a capacitor, comprising steps of:

providing a substrate having a conducting region;

forming a first insulation layer, a stop layer and a second insulation layer over the substrate, in order;

defining the second insulation layer, the stop layer and the first insulation layer, so as to form opening exposing the conducting region in the substrate;

forming a T-shaped conductive layer over the second insulation layer and filling the opening to make electrical connection with the conductive region, wherein the T-shaped conductive layer comprises a metal plate and a plug;

etching the second insulation layer by anisotropic etching with the metal plate as a mask to form a third insulation layer having an upper portion and a bottom portion, wherein the third insulation layer has a first distance measured from upper surface of the bottom portion of the third insulation layer to upper surface of the stop layer;

etching the third insulation layer by isotropic etching to form a fourth insulation layer having an upper portion and a bottom portion, wherein the fourth insulation layer has a second distance measured from upper surface of the bottom portion of the fourth insulation layer to the upper surface of the stop layer, and the plug is still covered by the upper portion of the fourth insulation layer;

forming a conductive layer on the metal plate and the fourth insulation layer;

etching the second conductive layer by anisotropic etching, so as to expose the metal plate and a portion of the fourth insulation layer; and etching the fourth insulation layer by isotropic etching, so as to expose the stop layer and the plug.

2. The method of claim 1, wherein the first insulation layer includes a silicon oxide layer.

3. The method of claim 1, wherein the first insulation layer includes a silicon oxide layer.

4. The method of claim 1, wherein the stop layer includes a silicon nitride layer.

5. The method of claim 1, wherein the T-shaped conductive layer includes a polysilicon layer.

6. The method of claim 1, wherein the conductive layer includes a polysilicon layer.

7. The method of claim 1, wherein the anisotropic etching includes dry etching.

8. The method of claim 1, wherein the isotropic etching includes wet etching.

9. A manufacturing method for forming a bottom electrode of a capacitor, comprising, steps of:

providing a substrate having a conducting region;

forming a first insulation layer, a stop layer and a second insulation layer over the substrate in order;

defining the second insulation layer, the stop layer and the first insulation layer, so as to form an opening exposing the conducting region in the substrate;

forming a patterned first conductive layer on the second insulation layer and filled in the opening, so as to be electrically connected with the conductive region;

etching the second insulation layer by anisotropic etching with the patterned first conductive layer as a mask to form a third insulation layer having an upper portion and a bottom portion, wherein the third insulation layer insulation layer has a first distance measured from upper surface of the bottom portion of the third insulation layer to upper surface of the stop layer;

etching the third insulation layer by isotropic etching to form a fourth insulation layer having an upper portion and a bottom portion, wherein the fourth insulation layer has a second distance measured from upper surface of the bottom portion of the fourth insulation layer to the upper surface of the stop layer;

forming a second conductive layer on the first conductive layer and the fourth insulation layer;

etching the second conductive layer by anisotropic etching, so as to expose a portion of the fourth insulation layer; and etching the second insulation layer by isotropic etching.

10. The method of claim 9, wherein the first insulation layer includes a silicon oxide layer.

11. The method of claim 9, wherein the first insulation layer includes a silicon oxide layer.

12. The method of claim 9, wherein the stop layer includes a silicon nitride layer.

13. The method of claim 9, wherein the patterned first conductive layer includes a polysilicon layer.

14. The method of claim 9, wherein the second conductive layer includes a polysilicon layer.

15. The method of claim 9, wherein the anisotropic etching includes dry etching.

16. The method of claim 9, wherein the isotropic etching includes wet etching.

* * * * *